United States Patent [19]

Mueller et al.

[11] Patent Number: 4,939,215

[45] Date of Patent: Jul. 3, 1990

[54] HEAT RESISTANT POLYBENZOXAZOLE FROM BIS-((AMINOHYDROXYPHENYL)HEXAFLUOROISOPROPYL)DIPHENYL ETHER

[75] Inventors: Werner H. Mueller, E. Greenwich; Dinesh N. Khanna, W. Warwick, both of R.I.

[73] Assignee: Hoechst Celanese Corporation, Summit, N.J.

[21] Appl. No.: 327,761

[22] Filed: Mar. 23, 1989

Related U.S. Application Data

[62] Division of Ser. No. 124,634, Nov. 24, 1987, Pat. No. 4,845,183.

[51] Int. Cl.$^5$ .............................................. C08G 73/22
[52] U.S. Cl. ......................................... 525/434; 428/1; 525/420; 528/183; 528/185; 528/347; 528/348
[58] Field of Search ................. 525/434, 420; 528/185, 528/183, 347, 348; 428/1

[56] References Cited

U.S. PATENT DOCUMENTS 3,449,296 6/1969 Angelo et al. ........................ 260/47
4,477,648 10/1984 Jones et al. ........................... 528/185
4,845,183 7/1989 Mueller et al. ....................... 528/185

FOREIGN PATENT DOCUMENTS 2188936 10/1987 United Kingdom .

Primary Examiner—Harold D. Anderson
Attorney, Agent, or Firm—Perman & Green

[57] ABSTRACT

Heat resistant, shapable, hydroxy and/or alkoxy-substituted polyamides derived from at least one diamine selected from unsubstituted and substituted 4,4'-bis[2-(4-amino-3-hydroxyphenyl)hexafluoroisopropyl)]diphenyl ether 4,4'-bis-[2-(3-amino-4-hydroxyphenyl)hexafluoroisopropyl]diphenyl ether and a dicarboxylic acid or a derivative thereof e.g. its acid halo or ester. The polyamides of the invention may be thermally cured to form polybenzoxazoles of higher heat resistance which are stable to hydrolytic, chemical and radiation attack.

The polyamides of the invention may be formed into shaped articles by molding, extrusion and solvent casting processes preferably in the presence of a solvent or diluent and then optionally converted into heat resistant, insoluble polybenzoxazoles. These shaped articles are useful in aircraft, electronic and other commercial applications where heat, chemical and radiation resistance are desired in conjunction with good mechanical and electrical properties.

13 Claims, No Drawings

HEAT RESISTANT POLYBENZOXAZOLE FROM BIS-((AMINOHYDROXYPHENYL)HEXAFLUOROISOPROPYL)DIPHENYL ETHER

This is a continuation of co-pending application Ser. No. 7/124,634 filed on Nov. 24, 1987, now U.S. Pat. 4,845,183.

BACKGROUND OF THE INVENTION

This invention is directed to the field of polyamides containing hexafluoroisopropylidene groups and polybenzoxazoles prepared therefrom. U.S. Pat. No. 3,449,296 discloses the preparation of polybenzoxazoles from aromatic hydroxy diamines and halide substituted dicarboxylic acids. The aromatic polyamides of this patent may be shaped into various forms at a temperature up to 275° C. and then converted to the polybenzoxazole by heating the molded product at about 275° to 475° C. for about one hour or more.

It is the object of this invention to provide novel polyamides of improved solubility, improved dielectric properties, flexibility and optical transparency which may be processed into shaped articles at low processing temperatures. After forming the polyamides of the invention to the desired shape they may be readily converted to the polybenzoxazole derivative which has high thermal, radiation, chemical and hydrolytic stability in conjunction with excellent mechanical properties.

SUMMARY OF THE INVENTION

This invention is that of novel, solvent soluble, heat resistant polyamides having a recurring structure in the polymer chain which may be represented by the formula:

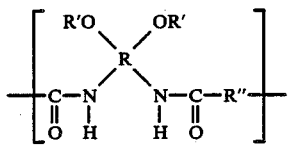

wherein:
(1) R is a tetravelent aromatic moiety of the formula:

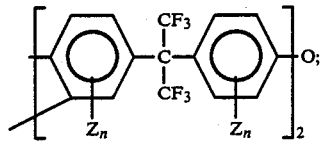

(2) R' is a monovalent moiety independently selected from

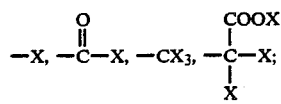

X is hydrogen or a substituent independently selected from:
lower alkyl of 1 to 8 carbons and substituted or unsubstituted phenyl; Z is independently selected from chloro, bromo, fluoro, iodo and lower alkyl of 1 to 6 carbons;
n is independently 0 or 1; and
(3) R" represents a substituted or unsubstituted alkylene, alicyclic or arylene moiety.

The polyamides of the invention either alone or in combination with other materials may be shaped into useful articles; e.g. by molding, extrusion, spinning, solution casting and other known processes. After forming shaped articles of the polyamides of the invention, they may be converted into polybenzoxazoles of higher heat resistance, excellent resistance to chemical attack and superior insulating and protective properties.

Illustrative applications of the polymers of the invention include molded parts such as high temperature insulators, pipes of high thermal stability and corrosion resistance, high temperature inert insulating, passivation, and protection films, high strength-heat resistant fibers, composite articles with other organic and/or inorganic fibers or open mats and other application obvious to the skilled artisan.

DESCRIPTION OF THE PREFERRED EMBODIMENTS

The invention is that of novel polyamides having a recurring structure in the polymer chain which may be represented by the following structure:

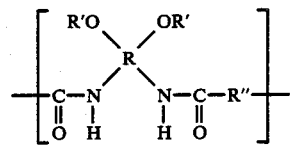

wherein:
(1) R is a tetravelent aromatic moiety of the formula:

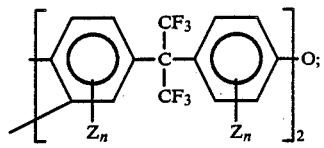

(2) R' is a monovalent moiety independently selected from

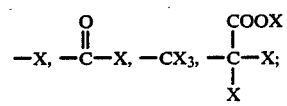

X is hydrogen or a substituent independently selected from:
lower alkyl of 1 to 8 carbons and substituted or unsubstituted phenyl; Z is independently selected from chloro, bromo, fluoro, iodo and lower alkyl of 1 to 6 carbons (e.g. methyl, ethyl, propyl, butyl, pentyl and hexyl);
n is independently 0 or 1; and
(3) R" represents a substituted or unsubstituted divalent alkylene, alicyclic or arylene moiety.

The polyamides of the invention may be prepared as homopolymers of the above structure or as copolymers with other diamines, preferably aromatic diamines and dicarboxylic acids, their derivatives, and mixtures thereof. The moiety R is present in amount from about 5 to 100 mole percent based upon the diamine components present in the polymer; preferably about at least 50 mole percent and more preferably about 70 to about 100 mole percent. Other diamines may be employed in preparing compositions with the scope of the invention, e.g. aromatic, and alicyclic diamine which may be optionally substituted with hydroxy, aryloxy and alkoxy groups positioned adjacent the carbon atom to which the amino substituent is positioned in order to convert the polyamide to the polybenzoazole. However, the incorporation of the alicyclic or aliphatic moiety will reduce the thermal stability of the polymer but they can be processed at lower temperatures.

The polyamides of the invention may be prepared by known methods, e.g. solution or interfacial polymerization methods as disclosed in U.S. Pat. Nos. 3,328,352 and 3,449,296, the disclosures of which are incorporated herein by reference. Typically polyamides are prepared by the condensation of a diamine and an acid halide of a dicarboxylic acid. However, they may be prepared by the condensation of a diamine and a dicarboxylic acid in the presence of a carbodiimide; see e.g. U.S. 4,622,285; the disclosure of which is hereby incorporated by reference. Similarly, the shaping of useful parts from and the conversion of hydroxy, aryloxy and alkoxy polyamides to polybenzoxazoles is known in the art see e.g. U.S. 3,449,296, in particular column 2, lines 33-62; the disclosure which is incorporated herein by reference. It should however be noted the polyamides of the invention will be converted to the polybenzoxazole form at lower temperature than the polyamides of U.S. Pat. No. 3,449,296. Typically, the polyamides of the invention may be converted to the polybenzoxazole form at a temperature from about 180° to 250° C. and they have a lower glass transition temperature which allows them to be shaped into useful articles at a lower temperature.

The molecular weight of the polyamides of the invention can also be controlled by known method e.g. catalyst concentration, reaction temperature, chain terminators etc. The polyamides of the invention should have a molecular weight sufficient to impart sufficient mechanical properties to the finished article for its intended purpose. Generally, the molecular weight should be such that the inherent viscosity of the polyamide be at least about 0.2, typically 0.5 to about 5.0. However, lower molecular weight products may be employed in the preparation of photoresist and similar applications; see e.g. U.S. Pat. No. 4,339,521 the disclosure of which is incorporated by reference. In a photoresist application, they may be employed as oligomers or precursors having a number average molecular weight less than about 2000.

The polyamides of the invention are prepared from at least one novel aromatic diamine selected from substituted and unsubstituted 4,4-bis[2-(3-amino-4-hydroxyphenyl)-hexafluoroisopropyl]diphenyl ether and the alkoxy and aryloxy substituted analogs e.g.:

bis[2-(3-amino-4-methoxyphenyl)hexafluoroisopropyl]diphenyl ether, bis[2-(3-amino-4-ethoxyphenyl)hexafluoroisopropyl]diphenyl ether, bis[2-(3-amino-2-chloro-4-ethoxyphenyl)hexafluoroisopropyl]-diphenyl ether, bis[2-(3-amino-4-phenoxyphenyl)hexafluoroisopropyl]diphenyl ether, bis[2-(3-amino-2-chloro-4-phenoxyphenyl)hexafluoroisopropyl]diphenyl ether, and bis[2-(3-amino-2-chloro-4-hydroxyphenyl)hexafluoroisopropyl]diphenyl ether The above diamines are used in the preparation of polyamides according to the invention in an amount from about 5 to 100 mole percent based upon the diamine component present in the polymerization formulation. This class of novel aromatic diamines may be prepared by following the procedure of the illustrative example below:

EXAMPLE 1

Preparation of 4,4'-Bis[2-(3-amino-4-hydroxyphenyl)-hexafluoroisopropyl]diphenylether (a) To a stainless steel pressure vessel are charged 4,4'-bis-(2-hydroxyphenyl)hexafluoroisopropyl)-diphenylether - prepared according to U.S. Pat. No. 3,355,500 -, phenol and hydrogen fluoride in a molar ratio of at least 1:2:10 and heated to temperature between 100° and 170° C. from 24 to 96 hours while stirring. After removing hydrogen fluoride by evaporation the solid residue is dissolved in ethanol and purified by refluxing in presence of charcoal. From the filtered solution a white crystalline precipitate of 4,4-bis[2-(4-hydroxyphenyl)hexafluoroisopropyl]diphenylether is obtained melting at 179°-180° C.

(b) 4,4-bis[2-(4-hydroxyphenyl)hexafluoroisopropyl]diphenyl ether is dissolved in diethylether and chilled to 10° C. At this temperature concentrated nitric acid is added dropwise. The reaction is finished 60 minutes later. The reaction mixture is then poured onto ice while stirring. The organic layer is separated, washed with a cold saturated solution of sodium bicarbonate and water and dried over magnesium sulfate. The diethylether is evaporated to yield 4,4'-bis[2-(4-hydroxy-3-nitrophenyl)hexafluoroisopropyl]diphenylether as a pale yellow solid.

The dry crude product is mixed with ethanol and catalytic amounts of 10% Pd on C in a stainless steel autoclave. After purging it with nitrogen and hydrogen the reaction is performed at ambient temperature and at a hydrogen pressure of about 100 bar until the hydrogen uptake is stopped. After separation of the catalyst by filtration the solvent is evaporated. The crude 4,4'-bis[2-(3-amino-4-hydroxyphenyl)hexafluoroisopropyl]diphenylether is then recrystallized from toluene to give a white product melting at 208°-209° C.

The polyamides of the invention may be prepared by the condensation polymerization of a diamine of the above class with a dicarboxylic acid, an acid halide of a dicarboxylic acid or the lower alkyl or phenyl esters of a dicarboxylic acid; preferably an aromatic dicarboxylic acid halide. Typical acid halides useful in the practice of the invention may be represented by the following formula:

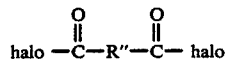

wherein R″ represents a divalent alkylene, alicyclic or aromatic moiety, preferably an aromatic moiety selected from

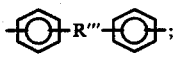

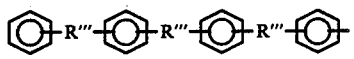

wherein R''' is a divalent moiety independently selected from a covalent carbon to carbon bond, methylene, ethylene, propylene, isopropylene, dichloro and difluoroalkylenes up to 3 carbons, hexafluoroisopropylidene, 1-phenyl-2,2,2-trichloroethylidene, oxy, thio, sulfinyl, sulfonyl, sulfonamido, carbonyl, oxydicarbonyl, oxydimethylene, sulfonyldioxy, carbonyldioxy, silanylene, disilanylene, polysilanylene up to 8 Si atoms; siloxanylene, disiloxanylene, and a polysiloxanylene up to 8 Si atoms. Preferably, the linking group R''' is selected from oxy, hexafluoroisopropylidene, carbonyl, methylene, a covalent carbon to carbon bond, siloxanylene, disiloxanylene and polysiloxanylenes, most preferably, hexafluoroisopropylidene, 1-phenyl-2,2,2-trichloroethylidene and oxy.

The hydrogen atoms of the linking group R'' and R''' may be substituted by non-interferring monovalent substituents such as chloro, fluoro, lower alkyl up to 6 carbons and phenyl. Also as used herein, the terms "aroxmatic" and "alicyclic" are meant to include heteroaromatics and heteroalicyclics wherein one or more of ring carbon atoms have been replaced with —O—, —S—, or —N— atoms.

Illustrative acid halides of aromatic dicarboxylic acids useful in the practice of the invention are the acid chlorides of:
isophthalic acid;
terephthalic acid;
4,4'-hexafluoroisopropylidene dibenzoic acid;
1,4-phenylenediethanoic acid;
4,4'-biphenyl dicarboxylic acid;
1,1-bis(4-carboxyphenyl)-1-phenyl-2,2,2-trifluoroethane;
4,4'-dicarboxy diphenyl ether;
bis-(4-carboxyphenyl)-methyl phosphane oxide;
4,4'-dicarboxyltetraphenylsilane;
bis(4-carboxyphenyl)-sulfone;
5-tertiary butyl isophthalic acid;
5-bromoisophthalic acid;
5-fluoro-isophthalic acid;
5-chloroisophthalic acid;
2,2-bis-(p-carboxyphenyl)propane;
4,4'-(p-phenylenedioxy) dibenzoic acid;
2,6-napthalene dicarboxylic acid and mixtures thereof.

The moiety R'' may be selected from an alkylene moiety having from one to twenty carbons or an alicyclic moiety of four to eighteen carbons. Illustrative compounds of this class of dicarboxylic acid halides are those of the following dicarboxylic acids:
1,4-cyclohexane dicarboxylic acid;
1,3-cyclopentane dicarboxylic acid; oxalic acid;
1,2-cyclobutane dicarboxylic acid;
1,4-cyclohexane diacetic acid; malonic acid;
1,10-decanedicarboxylic acid;
1,12-dodecanedicarboxylic acid; succinic acid;
1,18-octadecanedicarboxylic acid; glutaric acid;
2,6-cyclohexane dipropionic acid; adipic acid;
2,6-cyclohexane dihexanoic acid Other diamine comonomers may be employed in preparing polyamides of the invention which may or may not contain hydroxy, alkoxy or aryloxy substituents. Illustrative of these aromatic diamine comonomers that may be employed in the practice of the invention follow:

Hydroxy/Alkoxy/Aryloxy/Aromatic Diamines bis(3-hydroxy-4-amino)biphenyl;
bis(3-methoxy-4-amino)biphenyl;
1,2-bis(3-hydroxy-4-aminophenyl)ethane;
2,2-bis(3-hydroxy-4-amino-phenyl)propane;
bis(3-hydroxy-4-aminophenyl)bis(trifluoromethyl)methane;
bis(3-hydroxy-4-aminophenyl)ether;
bis(3-hydroxy-4-aminophenyl)sulfide;
bis(3-hydroxy-4-aminophenyl)sulfone;
bis(3-hydroxy-4-aminophenyl)ketone;
bis(3-hydroxy-4-aminophenyl)methane;
N-(3-hydroxy-4-aminophenyl)-3-hydroxy-4-aminobenzamide;
(3-hydroxy-4-aminophenyl)-3-hydroxy-4-aminobenzoate;
(3-hydroxy-4-aminophenyl)-3-hydroxy-4-aminophenyl carbamate;
N,N'-bis(3-hydroxy-4-aminophenyl)urea;
bis(3-amino-4-hydroxyphenyl)ether;
bis(3-amino-4-hydroxyphenyl)sulfide;
bis(3-amino-4-hydroxyphenyl)sulfone;
bis(3-amino-4-hydroxyphenyl)sulfoxide;
bis(3-amino-4-hydroxyphenyl)ketone;
bis(3-amino-4-hydroxyphenyl)methane;
1,2-bis(3-amino-4-hydroxyphenyl)ethane;
2,2-bis(3-amino-4-hydroxyphenyl)propane;
bis(3-amino-4-hydroxyphenyl)dimethyl silane;
bis(3-amino-4-hydroxyphenyl)dibutyl silane;
bis(3-amino-4-hydroxyphenyl)methyl phosphine;
bis(3-amino-4-hydroxyphenyl)butyl phosphine;
1,5-diamino-2,6-naphthalene diol;
1,6-diamino-2,5-naphthalene diol;
2,5-diamino-1,6-naphthalene diol;
2,6-diamino-1,5-naphthalene diol;
1,6-diamino-2,7-dihydroxy naphthalene;
2,5-diamino-1,7-dihydroxy naphthalene;
1,7-diamino-2,6-dihydroxy naphthalene;
2,7-diamino-1,6-dihydroxy naphthalene;
2,7-diamino-3,6-dihydroxy naphthalene;
3,7-diamino-2,6-dihydroxy naphthalene;
1,5-diamino-4,8-dihydroxy naphthalene;
1,5-diamino-2,6-dihydroxy anthracene;
1,8-diamino-2,7-dihydroxy phenanthrene;
1,4-diamino-2,5-dihydroxy benzene;
1,3-diamino-4,6-dihydroxy benzene;
bis(3-acetoxy-4-amino)biphenyl;
bis(3-thionoacetoxy-4-amino)biphenyl; methyl carbonate ester of
bis(3-hydroxy-4-amino)biphenyl;
bis(3-(carboxymethyleneoxy)-4-amino)biphenyl;
bis(3-(carbomethoxymethyleneoxy)-4-amino)biphenyl;
bis(3-(carbomethoxyethylideneoxy)-4-amino)biphenyl;
bis(3-thiocarbomethoxymethyleneoxy-4-amino)biphenyl;

bis(3-dithiocarbomethoxymethyleneoxy-4-amino)-biphenyl;
bis(3-dithiocarbomethoxymethyleneoxy-4-amino)-biphenyl;

Non-Hydroxy/Alkoxy/Aryloxy Diamines m-phenylene diamine;
p-phenylene diamine;
4,4′-diaminodiphenyl ether;
3,3′-diaminodiphenyl ether;
3,4′-diaminodiphenyl ether;
1,3-bis-(aminophenoxy)benzene (m-APB);
1,4-bis(aminophenoxy)benzene (p-APB); benzidine;
3,3′-dimethyl benzidine;
3,3′-diaminodiphenyl methane;
4,4′-diaminodiphenyl methane;
4,4′-diaminodiphenyl propane;
3,3′-diaminodiphenyl sulfone;
4,4′-diaminodiphenyl sulfone;
4,4′-diaminodiphenyl sulfide;
α,α′-bis(aminophenyl)p-diisopropylbenzene;
1,3-bis[4(4-aminophenoxy)-α,α′-bistrifluoromethyl]benzene;
2,2-bis[4-(4-aminophenoxy)-phenyl]hexafluoropropane;
hexafluoro-2,2-bis-(3-amino-4-methylhexafluoro2,2-bis-(4-aminophenyl)propane;
hexafluoro-2,2-bis-(3-aminophenyl)propane;
m-xylylenediamine;
p-xylylenediamine;
4,4′-bis(p-aminophenoxy)diphenyl sulfide;
4,4′-bis(3″-aminophenoxy)diphenyl sulfide;
4,4′(3″-aminophenoxy-(4′-aminophenoxy)-diphenyl sulfide;
4,4′-bis(p-aminophenoxy)diphenyl sulfone;
4,4′-bis-(3″-aminophenyl sulfone;
2,2-bis-[4′-p-aminophenoxy)phenyl]propane;
2,2-bis-[3′p-aminophenoxy)phenyl]propane;
1,1-bis-[4′(p-aminophenoxy)phenyl]ethylbenzene and mixtures thereof.

The solvents useful in the solution polymerization process for synthesizing the polyamide compositions of the present invention are the organic solvents whose functional groups do not react with either of the reactants to a greater extent than the reactants do with each other. Besides being inert to the reactants and, preferably, being a solvent for the product, the organic solvent must be a solvent for at least one of the reactants, preferably for both of the reactants. The normally liquid organic solvents of the N,N-dialkylcarboxylamide class are useful as solvents in the process of this invention. A preferred solvent is N,N-dimethylacetamide. It may easily be removed from the polyamide and/or polyamide shaped articles by evaporation, displacement or diffusion. Other typical compounds of this useful class of solvents are: N,N-diethylformamide, N,N-dimethylformamide, N,N-diethylacetamide, N,N-dimethylmethoxy acetamide, N-methyl caprolactam, etc. Other solvents which may be used in the present invention are: dimethylsulfoxide, N-methyl-2-pyrrolidone, tetramethylene urea, pyridine, dimethylsulfone, hexamethylphosphoramide, tetramethylene sulfone, formamide, N-methylformamide and N-acetyl-2-pyrrolidone. The above solvents can be used alone, in combination or in combination with other solvents such as benzene, benzonitrile, butyrolactone, xylene, toluene and cyclohexane. Furthermore, the polyamides of the invention have high solubility in other common solvents as illustrated in the following Example 10.

This invention will be more clearly understood by referring to the examples which follow. These examples, which illustrate specific embodiments of the present invention, should not be construed to limit the invention in any way.

EXAMPLE 2

To a solution of 4,4′-bis[2-(3-amino-4-hydroxyphenyl)hexafluoroisopropyl]diphenyl ether) (0.01 mole=6.84 gm) in dimethyl acetamide (50 ml) and pyridine (3.0 ml) was added a 50/50 mixture of isophthaloyl chloride and terephthaloyl chloride (0.005 moles isophthaloyl chloride =1.015 gm, 0.005 moles terephthaloyl chloride=1.015 gm) in 20 ml cyclohexanone dropwise with rapid stirring at −10° to −15° C. for 30 mins. After stirring overnight (24 hrs.) at room temperature, the resulting solution was poured into an ice-water mixture to precipitate the polymer. The polyamide was filtered, washed with water and dried under vacuum at 90° C. overnight. The yield was almost quantititative and the inherent viscosity of the polymer was 0.51 dl/g in dimethylacetamide (0.5% conc. 25° C.). The polymer has a glass transition temperature Tg, of 215° C.

EXAMPLE 3

The procedure of Example 2 was repeated using 2.03 g (0.01 mole) of isophthaloyl chloride in place of the mixed acid chlorides of Example 2. A solvent soluble polyamide was recovered which can be converted to the polybenzoxazole form by heating at 250°–300° C. for 1.0 hour. The inherent viscosity of the polyamide of this Example is 0.18 dl/g in dimethylacetamide at 0.5% concentration at 25° C.

EXAMPLE 4

The procedure of Example 2 may be repeated using 2.03 g (0.01 mole) of terephthaloyl chloride in place of the mixed acid chlorides of Example 2. A solvent soluble polyamide will be recovered which can be converted to the polybenzoxazole form by heating at 200°–300° C. for 1.0 hour.

EXAMPLE 5

The procedure of Example 2 may be repeated using 4.29 g (0.01 mole) of 2,2-hexafluoro-bis(4-chlorocarbonylphenyl)propane in place of the mixed acid chlorides of Example 2. A solvent soluble polyamide will be recovered which can be converted to the polybenzoxazole form by heating at 300°–300° C. for 1.0 hour.

EXAMPLE 6

The procedure of Example 2 may be repeated using 7.47 g (0.01 mole) of 4,4′-bis[2-(4-chlorocarbonylphenyl)hexafluoroisopropyl]diphenyl ether in place of the mixed acid chlorides of Example 2. A solvent soluble polyamide will be recovered which can be converted to the polybenzoxazole form by heating at 200°–300° C. for 1.0 hour.

The procedure for preparing the above dicarboxylic acid chloride is as follows:

Preparation of the Acid Chloride of 4,4′-Bis[2-(4-carboxy-phenyl)hexafluoroisopropyl]diphenylether (a) To a clean, dry stainless steel autoclave are charged 4,4′-bis(2-hydroxy-hexafluoroisopropyl)diphenylether-synthesized according to U.S. Pat. No. 3,355,500-toluene and hydrogen fluoride in a molar ratio of at least 1:2:10 followed by sealing and heating at temperatures between 100° and 170° C. for 24 to 96 hours. At 80° C. the autoclave is vented and hydrogen fluoride is evaporated. After cooling to room temperature methylene chloride is added and the reaction mixture is discharged into water. The organic layer is separated, washed twice with water and dried over calcium chloride. The solvent is stripped off and the residue is recrystallized from ethanol yielding 4,4'-bis[2-(4-methylphenyl)hexafluoroisopropyl]-diphenylether. M.P. 80°–90° C.

(b) 4,4'-bis[2-(4-methylphenyl)hexafluoroisopropyl]-diphenylether is dissolved in acetic acid and a catalyst prepared from $Co(OAc)_2 \cdot 4\ H_2O$, $Mn(OAc)_2 \cdot 4\ H_2O$ and HBr in acetic acid is added. The reaction is performed in a glass pressure vessel by heating the mixture up to 180° C. and an oxygen pressure of 6.5 bar. After the oxygen uptake has finished the contents of the reaction vessel are discharged into a distillation apparatus and acetic acid is distilled off. The residue is cooled to room temperature and the crystalline product is collected on a funnel. After washing several times with acetic acid and water the 4,4'-bis[2-(4-carboxyphenyl)hexafluoroisopropyl]diphenylether is dried in vacuo. M.P. 238°–240° C.

(c) To a slurry of 4,4'-bis[2-(4-carboxyphenyl)hexafluoroisopropyl]diphenylether in thionylchloride is added a few drops of dimethylformamide. The mixture is heated at reflux till the evolution of hydrogen chloride stops. The excess of thionylchloride is stripped off. Toluene is added to remove the residual thionylchloride by distillation. The solvent is stripped off and the crude product is recrystallized from n-hexane. M.P. 144°–145° C.

EXAMPLE 7

The procedure of Example 2 may be repeated using 2.95 g (0.01 mole) of oxydiphthaloyl chloride (4,4'para-diphenyl ether dibenzoyl chloride) in place of the mixed acid chlorides of Example 2. A solvent soluble polyamide will be recovered which can be converted to the polybenzoxazole form by heating at 200°–300° C. for 1.0 hour.

EXAMPLE 8

The procedure of Example 2 may be repeated using 3.87 g (0.01 mole) of 4,4'-para-phenylenedioxy dibenzoyl chloride in place of the mixed acid chlorides of Example 2. A solvent soluble polyamide will be recovered which can be converted to the polybenzoxazole form by heating at 200°–300° C. for 1.0 hour.

EXAMPLE 9

The procedure of Example 2 may be repeated using 2.53 g (0.01 mole) of 2,6-naphthalene diacid chloride in place of the mixed acid chlorides of Example 2. A solvent soluble polyamide will be recovered which can be converted to the polybenzoxazole form by heating at 300°–350° C. for 1.0 hour.

EXAMPLE 10

The solubility of the polyamide of Example 2 was determined in various solvents. The determination was done in a qualitative manner to determine the approximate solubility of the polymer and it was found to have a solubility of approximately 30 percent by weight in the following solvents:

Acetone
α-Butyrolactone
Methyl cellosolve
Propylene glycol methyl ether
N-Methyl Pyrrolidone
Dimethyl Acetamide
Tetrahydrofuran The polyamide of Example 2 was found to be insoluble in mineral spirits and hexane. This example illustrates the good solubility of the polyamides of the invention in a variety of common solvents. This high solubility provides a means to produce thick films for instance in photoresist and protective layer applications and high solids solution provide efficiency and improved output in the production of solution spun fibers and cast films.

EXAMPLE 11

The procedure of Example 2 was repeated using as diamine comonomers, 2.928 g (0.008 moles) of 2,2-hexafluoro-bis-(3-amino-4-hydroxyphenyl)propane and 1.368 g (0.002 moles) of 4,4'-bis[2-(3-amino-4-hydroxyphenyl)hexafluoroisopropyl]-diphenyl ether. A 50/50 mixture of isophthaloyl chloride (0.005 mole-1.015 g) and terephthaloyl chloride (0.005 mole-1.015 g) was used as the dicarboxylic acid chloride component. The resulting polyamide had an inherent viscosity of 0.18 dl/g at 0.5% by weight concentration in dimethylacetamide at 25° C.

EXAMPLE 12

The polyamide of Example 2 was dissolved in methyl cellosolve at a concentration of 10% by weight and cast on an aluminum plate into a film. This film was dried at 90° C. and a tough, flexible, transparent, slightly yellow film was obtained. The film was then heated for one hour at 225° C. and converted to the polybenzoxazole. The resulting film was insoluble in methyl cellosolve and it was tough and flexible. The film could be folded and creased without breaking.

EXAMPLE 13

The polyamide of Example 11 was prepared into a photoresist composition. This composition included the following:

| | |
|---|---|
| Example 11 Polyamide | 0.67 g |
| Photosensitizer | 0.33 g |
| Methyl ethyl ketone | 6.0 g |
| Propylene glycol methyl ether | 4.0 g |
| Crystal violet dye | 0.04 g |

A solution was made of the above listed ingredients and filtered. The solution was then roller coated on an anodized aluminum plate and the coated plate was dried at 90° C. for 3 minutes to obtain a resist film of 2–3 micron thickness. The resist was covered with a photomask having a striped pattern and irradiated with a UV mercury vapor lamp of 200 watts power which produced an intensity of 5 milliwatts/$cm^2$ at a wavelength of 365 nanometers. The irradiation time was 60 seconds. The exposed plate was then developed in aqueous base developer (AZ Developer diluted with two parts of water). The developed plate was rinsed with water to obtain a fine, well defined relief pattern having a minimum line thickness of 2 microns. The relief pattern upon heating to 300° C. showed no blurring of the image or loss of resolution.

The photosensitizer used in this experiment was a trihydroxybenzophenone-1,2-naphthoquinone diazido-5-sulfonic acid mixed ester. The aqueous base developer was AZ Developer available from Hoechst Celanese Corporation, Somerville, New Jersey. The procedures for preparing and developing photoresist is known in the art; see e.g. U.S. Patent 4,339,521, the disclosure of which is hereby incorporated by reference.

EXAMPLE 14

A polyamide prepared in accordance with Example 2 can be molded into a shaped article using the following procedure:

A round electrically heated mold having a diameter of approximately 75 mm and a depth of approximately 50 mm is filled half full with a polyamide that is prepared in accordance with the procedure of Example 2. The mold is then purged with nitrogen and a fitting mold plug having sufficient clearance to vent off gases is inserted into the mold. A force of 5000 psi is applied to the mold plug to compress the polyamide powder. The mold is heated to 175° C. and is held at that temperature for 30 minutes. The mold is then heated to 250° C. and is held at that temperature for one hour while maintaining the 5000 psi pressure. The mold is then cooled to below 100° C., the pressure reduced and the molded part removed from the mold. A round, well formed, fused disc of the polyamide converted to polybenzoxazole form will be obtained which can be used as an insulator.

The solvent solution polyamides of the invention (which can be converted to the polybenzoxale form) have numerous applications. They can be solution spun into fibers to produce heat and flame resistant fabrics. They can be molded with various polymers and fillers to produce parts having high strength at high service temperatures. When used in combination with other polymers of lower thermal resistance, the polybenzoxazoles provided by the polyamides of invention can increase the thermal resistance of the polymer blend. Molded parts can be produced with various fillers such as glass, graphite, molybdenum to provide heat resistant parts of low coefficient of thermal expansion and friction. Laminates can be made in high pressure platen presses, low pressure vacuum bags or moderate pressure vacuum autoclove bags. Solutions of the polyamides can be used to impregnate glass, graphite, polyimide, polyester and like fibers to produce laminates with flame and heat resistance and excellent electrical properties. As previously stated the polybenzoxazole product has excellent thermal, chemical, hydrolytic and radiation resistance, and low dielectric properties which make it ideally suited for electronic applications such as photoresists, passivation and insulating layers and molded circuit board applications. In addition, the polyamides of the invention can be prepared as a foamed product suitable as high temperature thermal insulation and useful in the production of structural laminates of high strength and low weight. In the presence of a low boiling solvent the polyamide of the invention can be extruded into a formed shape below the polybenzoxazole formation temperature and then thermally annealed to provide the polybenzoxazole of higher thermal and chemical stability.

Another application of the polyamides/polybenzoxazoles of the invention is the manufacture of liquid crystal display devices (LCD's) wherein they provide orientation layers. The preparation of liquid crystal displays and their orientation layers are known; see, for example, U.S. Pat. No. 4,619,500 and U.K. Pat. No. 1,372,868 which are incorporated by reference. In the preparation of liquid crystal displays, it is necessary to bond the mating glass substrates and some method of removing the orientation layers from the peripheral seal areas must be employed or the seal area is kept clean by using a template or structured device in the application of the orientation layer material; in either method the peripheral seal area is kept clean to effectively bond the mating glass substrates.

LCD orientation layers of polyimides have been prepared in the past from a solution of a polyamic acid (polyamidocarboxylic acid) in a solvent which is applied to the electrode base layer or to the electrode based plate. After application, the solvent is evaporated and the coated substrate is heated to about 250° C., whereby the polyimide is formed. The polyimide layer is then given an orientation treatment to align the polyimide molecules. Orientation is effected by brushing or rubbing the film in one direction; see, for example, U.S. Pat. No. 4,068,923, which describes the orientation technique.

U.S. Pat. No. 4,619,500 describes a method of preparing a LCD orientation layer from a polyoxazole precursor in solution with a volatile compound and a photosensitive diazide; the teachings of which are incorporated by reference. Generally, polyoxazoles have a brownish/amber color which is not desirable in LCD orientation layers. Although this characteristic is present in the polybenzoxazoles of the invention, it is significantly reduced in comparison to the polybenzoxazoles of the prior art. In addition, the high solubility of the polyamides of the invention allows one to cast uniform films of low thickness and they are of high transparency.

The polyamide of the invention may be used to produce orientation layers for liquid crystal devices by dissolving the polymer in a suitable solvent such as N-methylpyrrolidone, propylene glycol methyl ether, etc. at a concentration of 10% by weight. The electrode base plate is roller coated with this solution keeping the peripheral seal area clean by use of a mask or profiled roller. The coated base plate is then dried at about 90°-100° C. and then annealed at about 150/300° C. in a two step annealing process for ½ to 1.0 hour at each temperature. Orientation of the annealed polybenzoxazole is then conducted by brushing the film in one direction or by rubbing with a cloth in one direction. The LCD device is then assemblied by joining two such base plates at their peripheral seal areas by cementing or glass soldering Orientation layers up to 1 micron thick show little color and below 0.5 micron they are clear and highly transparent.

The polyamides of the invention may also be employed in photosensitive compositions to produce liquid crystal displays. Typical photoresist compositions are also disclosed in U.S. Pat. No. 4,619,500 (negative resist) and U.S. Pat. No. 4,395,482 (positive resist) which are incorporated herein by reference. The electrode base plate is coated with the photo-sensitive composition, dried, imagewise exposed and developed in a suitable solvent to remove the polymeric film at the peripheral seal area. The exposed portion is either the seal area (positive resist) or the orientation layer or non seal area portion (negative resist). The coated base plate is then annealed and oriented as described above.

The invention has been described by way of the above specification and illustrative examples it is to be understood that this invention is not limited to the specific embodiments thereof except as defined by the following claims:

We claim:

1. A polybenzoxazole comprising the following recurring structure in the polymer chain:

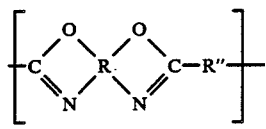

wherein:

R is a tetravalent aromatic moiety having the formula:

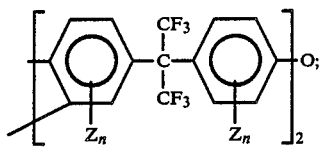

R" is selected from an alkylene, alicyclic or aromatic moiety; Z is independently selected from chloro, bromo, fluoro, iodo or lower alkyl of 1 to 6 carbons and n is independently 0 or 1.

2. A polybenzoxazole according to claim 1 wherein R is:

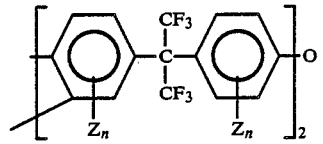

wherein the 3 and 3' ring bonds ,are linked to an nitrogen atom in the polymer chain and 4 and 4 ring bonds are linked oxygen atom in said chain.

3. A film comprising a polybenzoxazole according to claim 1 or 2.

4. A shaped part comprising a polybenzoxazole according to claim 1 or 2.

5. A liquid crystal display orientation layer comprising a polybenzoxazole according to claim 1 or 2.

6. The polybenzoxazole of claim 1 wherein n is 0.

7. The polybenzoxazole of claim 6 wherein R is the amide condensation residuum of the amine:
4,4'-bis[2-(3-amino-4-hydroxyphenyl)-hexafluoroisopropyl]diphenyl ether. diphenyl ether.

8. The polybenzoxazole of claim 7 further including the amide condensation residuum of 2,2-hexafluoro-bis-(3-amino-4-hydroxyphenyl) propane in the polymer structure.

9. The polybenzoxazole of claim 1 which is based on the amide condensation residuum of one or a mixture of acid halides having the formula:

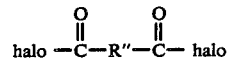

wherein R" represents a divalent alkylene, alicyclic or aromatic moiety, and halo represents halogen.

10. The polybenzoxazole of claim 9 wherein the acid halide is selected from the group consisting of isophthaloyl chloride, terephthaloyl chloride, 2,2-hexafluoro-bis-(4-chlorocarbonylphenyl propane, 4,4'-bis[2-(4-chlorocarbonyl-phenyl) hexafluoroisopropyl] diphenyl ether, 4,4'para-diphenyl ether dibenzoyl chloride, 4,4'-para-phenylenedioxy dibenzoyl chloride, 2,6-naphthalene diacid chloride, and mixtures thereof.

11. The polybenzoxazole of claim 10 wherein the acid halide is a mixture of isophthaloyl chloride and terephthaloyl chloride.

12. The polybenzoxazole of claim 10 wherein the acid halide consists of isophthaloyl chloride.

13. The polybenzoxazole of claim 10 wherein the acid halide consists of terephthaloyl chloride.

* * * * *